United States Patent
Ito

(10) Patent No.: US 8,309,954 B2
(45) Date of Patent: Nov. 13, 2012

(54) INSULATING THIN FILM, FORMATION SOLUTION FOR INSULATING THIN FILM, FIELD-EFFECT TRANSISTOR, METHOD FOR MANUFACTURING THE SAME AND IMAGE DISPLAY UNIT

(75) Inventor: Yutaka Ito, Tokyo (JP)

(73) Assignee: Toppan Printing Co., Ltd. (JP)

( * ) Notice: Subject to any disclaimer, the term of this patent is extended or adjusted under 35 U.S.C. 154(b) by 223 days.

(21) Appl. No.: 12/732,119

(22) Filed: Mar. 25, 2010

(65) Prior Publication Data

US 2010/0289024 A1 Nov. 18, 2010

(30) Foreign Application Priority Data

May 12, 2009 (JP) ................................. 2009-115547
May 27, 2009 (JP) ................................. 2009-127561

(51) Int. Cl.
*H01L 29/08* (2006.01)
(52) U.S. Cl. ............... 257/40; 257/59; 257/72; 257/258
(58) Field of Classification Search ................... 257/59, 257/72, 258, 40
See application file for complete search history.

(56) References Cited

U.S. PATENT DOCUMENTS

2004/0161873 A1* 8/2004 Dimitrakopoulos et al. ... 438/99

FOREIGN PATENT DOCUMENTS

| JP | 2001-352068 | | 12/2001 |
| JP | 2002-028961 | | 1/2002 |
| JP | 2002-110999 | * | 4/2002 |
| JP | 2003-258260 | | 9/2003 |
| JP | 2004-055649 | | 2/2004 |
| JP | 2004-200365 | | 7/2004 |
| JP | 2005-120371 | | 5/2005 |
| JP | 2006-070029 | | 3/2006 |
| JP | 2008-147410 | | 6/2008 |
| JP | 2008-166764 | | 7/2008 |

OTHER PUBLICATIONS

Ashok Maliakal, Howard Katz, Pat M. Cotts, Shekhar Subramoney, Peter Mirau—"Inorganic Oxide Core, Polymer Shell Nanocomposite as a High K Gate Dielectric for Flexible Electronics Applications"; J.Am Chem. Soc 2005, 127, 14655-14662.
Fang-Chung Chen, Chih-Wei Chu, Jun He, Yang Yang; Organic thin-film transistors with nanocomposite dielectric gate insulator; Applied Physics Letters vol. 85, No. 15, Oct. 11, 2004; 3295-3297.

* cited by examiner

*Primary Examiner* — Tan N Tran
(74) *Attorney, Agent, or Firm* — Squire Sanders (US) LLP

(57) ABSTRACT

One embodiment of the present invention is an insulating thin film having a polymer compound, a metallic atom bonded to the polymer compound through an oxide atom and selected from a group 4 element, a group 5 element, a group 6 element, a group 13 element, zinc or tin, and an organic molecule bonded to the metallic atom through the oxide atom or a nitrogen atom.

12 Claims, 11 Drawing Sheets

INSULATING THIN FILM, FORMATION SOLUTION FOR INSULATING THIN FILM, FIELD-EFFECT TRANSISTOR, METHOD FOR MANUFACTURING THE SAME AND IMAGE DISPLAY UNIT

CROSS REFERENCE TO RELATED APPLICATION

This application is based on and claims the benefit of priority from the Japanese Patent Application number 2009-115547, filed on May 12, 2009 and the Japanese Patent Application number 2009-127561, filed on May 27, 2009; the entire contents of which are incorporated herein by reference.

BACKGROUND OF THE INVENTION

1. Field of the Invention

The present invention relates to an insulating thin film, a formation solution for the insulating thin film, a method for manufacturing the insulating thin film, a field-effect transistor, a method for manufacturing the field-effect transistor and an image display unit. Particularly, the present invention relates to the insulating thin film having high insulating properties and high electric permittivity, the formation solution for the insulating thin film, the method for manufacturing the insulating thin film, the field-effect transistor, the method for manufacturing the field-effect transistor and the image display unit.

2. Description of the Related Art

In recent years, most of the display units which are widely used in general such as a liquid crystal display, an organic light emitting diode (OLED) display and an electrophoretic form display employ a drive unit of an active matrix type in which a thin film transistor (TFT) is utilized as a display switching device. The field-effect transistor (FET) having a gate electrode, a gate insulating layer, a source electrode-a drain electrode and a semiconductor arranged between the source electrode and the drain electrode is utilized as the TFT for this kind of the display switching device. A drive principle of FET is to control an amount of a charge carrier of an electron or a hole of the semiconductor by applying a voltage to the gate electrode and control transference of a charge between the source electrode and the drain electrode, in other words the drive principle is to control an electrical current. FET plays a role of a switching device as it operates the above.

An amorphous thin film silicon or a polycrystalline thin film silicon is traditionally used as the semiconductor of the above described TFT array. Each layer such as the electrode, the semiconductor and the insulting layer of the thin film silicon TFT generally requires a vacuum process and a high-temperature process with more than 300 degrees Celsius. Further, a photolithographic method is used for patterning. This indicates that the TFT is formed by the relatively complicated high-cost process.

Compared with the past, in these days, it has been proposed that a solution dispersion nano-metal particle should be used for an electrode material, an organic semiconductor should be used for a semiconductor and a material which can be solved or dispersed in a solvent such as an organic polymer compound should be used for an insulating material. Further, a great number of a method which uses a coating method such as an ink jet method, a spin coating method or a flexographic printing method has been reported.

Due to this, lowering the temperature, heightening the speed and reducing the cost of the process have been realized.

As a coating material which can be solved or dispersed in a solvent and forms the gate insulating layer, an organic polymer compound, an organic-inorganic hybrid material in which an organo metallic compound is used (referred to patent documents 1-4) and a composite material in which metal oxide particles are mixed (referred to patent document 5 and non-patent documents 1 and 2) have been traditionally studied. In addition, it has been proved that the above mentioned materials can be used as the material of FET gate insulating layer when the gate insulating layer is formed by coating.

The gate insulating layer formed by the organic polymer compound has sufficient insulating properties. However, the gate insulating layer frequently has insufficient FET properties, because the gate insulating layer generally has low relative permittivity of approximately 2.5-3.8. Therefore, the material having high permittivity has been required. Under this circumstance, by adding the metal oxide material which has high permittivity, the organic-inorganic hybrid material and the organic-inorganic composite material are able to have high permittivity which cannot be obtained by only an organic material and hence a use of this kind of materials has been widely studies.

However, there is a problem in a use of the organic-inorganic hybrid material. A thin film is formed by coating the organic-inorganic hybrid material which has the organic metal oxide compound after a hydrolysis process is performed using acid or base. Hence, insulating properties cannot be sufficiently obtained, because the thin film is influenced by acid or base which remains inside of the film. Thus, it led to a new problem such as an occurrence of a high leak current. In addition, when the organic-inorganic composite material is used for FET, since the particles are added to the organic-inorganic composite material, the surface asperity is caused by variation in dispersion of the particles in the film or shape of the particles. Thus, FET properties become poorly-reproducible.

In addition, by adding silicon oxide to the organic-inorganic hybrid material or the organic-inorganic composite material of the related art, stabilization of the material properties are improved. However, in return for the stabilization, the organic-inorganic hybrid material or the organic-inorganic composite material requires a relatively high temperature baking because of its poor reactivity. Further, after the thin film is formed, since the materials have a weak tolerance for a post-processing such as a surface processing for the insulating thin film, FET properties has been made poor because of change in a shape of the surface or chemical properties caused by the hard processing.

Moreover, strong acid or strong base is used for the process for manufacturing TFT, for example, a photoresist development and abrasion which are carried out at the time of patterning by photolithography, and etching the semiconductor, the electrode or the like. Therefore, there is a problem that materials for the electrode, the insulator and the semiconductor formed on a substrate are separated from the substrate by the developing solution or etchant. In particular, when a plastic film is used as a substrate, adhesion between the plastic and the metal or the metal oxide is not sufficient. Moreover, even though adhesion is improved by the surface processing of the substrate such as a UV/ozone treatment or a corona treatment, a bond between the substrate and the metal or metal oxide is chemically degraded because of acid or base. Thus, this problem is remarkable.

The present invention provides an insulating thin film and a formation solution for the insulating thin film. The insulating thin film can be formed by coating the solvent at a low temperature and has high insulating properties and high tolerance for a solvent. In addition, a surface processing can be performed on its surface. Further, the purpose of the present invention is to provide a field-effect transistor having excellent properties, a method for manufacturing thereof and an image display unit, in which the insulating thin film is utilized.

Patent Document 1: JP-A-2005-120371
Patent Document 2: JP-A-2006-070029
Patent Document 3: JP-A-2008-147410
Patent Document 4: JP-A-2008-166764
Patent Document 5: JP-A-2004-055649
Patent Document 6: JP-A-2004-200365
Patent Document 7: JP-A-2001-352068
Patent Document 8: JP-A-2002-28961
Patent Document 9: JP-A-2003-258260
Non-patent Document 1: J. Am. Chem. Soc. 127, 14655 (2005)
Non-patent Document 2: Appl. Phys. Lett. 85, 3295 (2004)

SUMMARY OF THE INVENTION

One embodiment of the present invention is an insulating thin film having a polymer compound, a metallic atom bonded to the polymer compound through an oxide atom and selected from a group 4 element, a group 5 element, a group 6 element, a group 13 element, zinc or tin and an organic molecule bonded to the metallic atom through the oxide atom or a nitrogen atom.

10: a substrate, 20: a gate electrode, 30: a gate insulating layer, 31: a self-assembled monolayer, 40: a source electrode, 50: a drain electrode, 60: a semiconductor, 70: an under-layer, 100/200: a field-effect transistor, 101: a substrate, 102: a gate electrode, 103: a gate insulating layer, 104: a semiconductor layer, 105: a source electrode, 106: a drain electrode, 107: a protective layer, 108: an under-layer, 300: an image display unit, 301: an inter-layer insulating layer, 302: a pixel electrode, 303: image display medium, 304: a counter electrode

DETAILED DESCRIPTION OF THE INVENTION

The embodiments of the present invention are explained in detail below. The same constituent elements have the same identical signs in the embodiments and therefore duplicative explanations between the embodiments are omitted.

Figure 1:
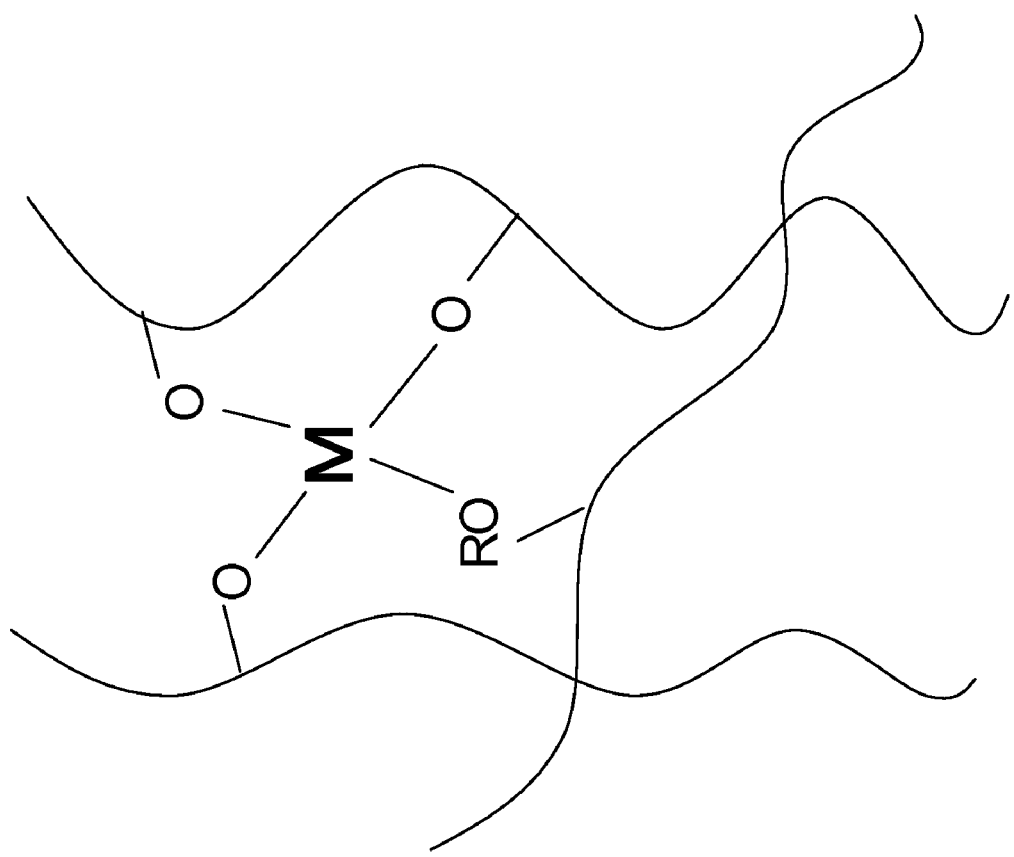
FIG. 1 is a view showing a frame format of a chemical structure of an insulating thin film in an embodiment of the present invention.

The insulating thin film in the embodiment of the present invention has a polymer compound, a metallic atom and an organic molecule. The characteristics of the insulating thin film is that the polymer compound and the metallic atom are bonded through an oxygen atom, and the organic molecule and the metallic atom are bonded through the oxygen atom or a nitrogen atom. FIG. 1 is a view showing a frame format of a chemical structure of an embodiment of the insulating thin film of the present invention, in which the metallic atom is bonded to the polymer compound through the oxygen atom. M is a metallic atom. R is an organic molecule. As shown in FIG. 1, the insulating thin film of the present invention is cross-linked where the polymer compound is bonded to the metallic atom through the oxygen atom or a nitrogen atom.

As the metallic atom used for the insulating thin film in the embodiment of the present invention, a metal selected from a group 4 element, a group 5 element, a group 6 element, a group 13 element, zinc or tin can be used. The characteristic of the metallic atom is that the metallic atom does not include a silicon atom. The insulating thin film in the embodiment of the present invention is formed by reacting the polymer compound and the organic molecule with a compound of the above mentioned metal. As a particular metallic compound, an alkoxide compound, a halogenated compound, an alkyl compound, a cyclopentadienyl compound, an amino compound, an acetylacetonate compound or an isocyanate compound can be used. More particularly, tetraisopropyl titanate, tetrabutyl titanate, tetrakis acetylacetonato titanium, titanium chloride, titanium dioctyloxy-bis(octylene glycolate), titanium diisopropoxy-bis(triethanolaminato), titanium lactate, tetrapropyl zirconate, tetrabutyl zirconate, zirconium tetrakis acetylacetonato, zirconium tributoxy monoacetylacetonato, zirconia chloride, octane acid zirconium, tetrakis dimethylamino zirconium, tetrapropyl hafnate, tetrabutyl hafnate, tetrakis acetylacetonato hafnium, hafnium chloride, pentaethyl niobate, pentabutoxy niobate, niobium chloride, pentaethyl tantalate, pentabutyl tantalate, tantalum chloride, molybdenum chloride, zinc chloride, zinc oxalate, zinc propionate, aluminum isopropoxide, aluminum butoxide, aluminum chloride, triisobutyl aluminum, aluminum trisacetylacetonate, indium trisacetylacetonate, indium chloride, tin chloride or butyl tin chloride can be exemplified. However, a usable metallic compound is not limited to these.

The polymer compound used for the insulating thin film in the embodiment of the present invention is bonded to the metallic atom through the oxygen bond in the insulating thin film. By bonding the polymer compound to the metallic atom, permittivity is improved by an addition of the metallic atom. Moreover, also, the film structure of the insulating thin film is stabilized, because the polymer compounds are cross-linked. In addition, the number of a liberated polar substituent group can be hold to be as small as possible.

Therefore high insulating properties can be obtained.

As the polymer compound used for the insulating thin film in the embodiment of the present invention, it is required to select the polymer compound which can react and be bonded to the above mentioned metallic compounds or the like through the oxygen atom. For example, a polymer compound having a functional group which can be a precursor convertible into a hydroxyl group, an alcohol group, a carboxyl group, an epoxide group, or a substituent group thereof can be preferably used.

In other words, the functional group which is exemplified in a monomer unit of the polymer compound is preferably included in each unit, at regular intervals, or at random.

As a particular polymer compound, acrylpolyol resin, esterpolyol resin, block copolymer or acrylate resin in which polyvinyl alcohol, polyvinyl phenol, acetylcellulose, epoxy resin or hydroxyalkyl acrylate is used can be exemplified. However, a usable polymer compound is not limited to these.

The organic molecule used for the insulating thin film in the embodiment of the present invention is bonded to the metallic atom through the oxygen atom or the nitrogen atom inside of the insulating thin film. The reason the organic molecule is bonded to the metallic atom is to stabilize the film structure of the insulating thin film and to obtain high insulating properties by the cross-linkage. In addition, the reason is to obtain the effect of providing the stabilization to the metallic compound which has a high reactivity and to provide the formation solution for the insulating thin film by giving solubility to the formation solution for the insulating thin film obtained by the combination. The insulating thin film can be formed by a simple coating method or a printing process using the formation solution for the insulating thin film in the embodiment of the present invention.

As the organic molecule used for the insulating thin film in the embodiment of the present invention, it is required to select the organic molecule which can react and be bonded to the metallic atom through the oxygen atom or the nitrogen atom. In addition, a reactive substituent group of the organic molecule is preferably bonded to the above mentioned polymer compound.

For example, the organic molecule having a functional group which can be a precursor convertible into a hydroxyl group, an alcohol group, an aldehyde group, a carboxyl group, an epoxy group, an amino group, an isocyano group, an imino group, an acrylic group, an ester group, a sulfonic group, or a substituent group thereof can be preferably used.

More particularly, ethylene glycol, propylene glycol, glucose, urea, guanidine, phenol, cresol, catechol, catecholamine, melamine, hydroxyethyl acrylate, oxalic acid, malonic acid, succinic acid, adipic acid, phthalic acid, isophthalic acid, terephthalic acid, compounds resembling thereof or the like can be exemplified as the organic molecule. However, a usable organic molecule is not limited to these.

Figure 2:
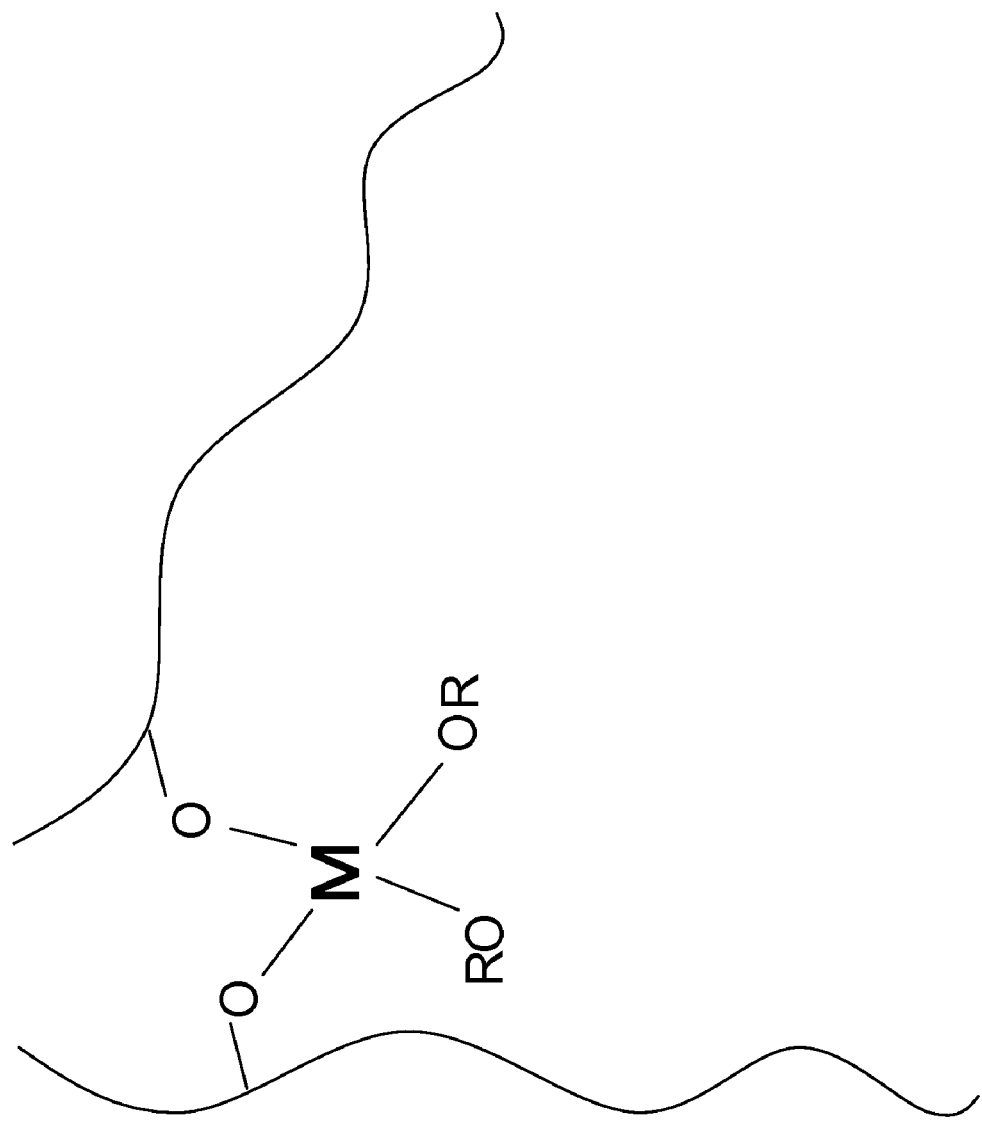
FIG. 2 is a view showing a frame format of a chemical structure of a solute material for an insulating thin film in an embodiment of the present invention.

The formation solution for the insulating thin film in the embodiment of the present invention can be obtained as follows. At least one kind of a metallic atom is selected from the above mentioned metallic atoms and a metallic compound corresponding to the metallic atom is solved in a solvent. In addition, a polymer compound and an organic molecule are arbitrarily selected from the above mentioned polymer compounds and organic molecules. Thereafter, each molecule is solved in the same solvent or different solvents. Then, after the appropriate conditions are taken into account, the formation solution can be obtained by mixing the metallic compound and the molecules. FIG. 2 shows a view showing a frame format of a chemical structure of a solute material for an insulating thin film of the present invention.

When only the metallic compound is used, reactivity of the metallic compound is so fast that polymerization is promoted also at room temperature. Hence, if the metallic compound is more than a certain amount when used for the cross-linkage of polymer compound, the metallic compound clumps together and settles in the solvent. In the present invention, solubility is controlled by bonding the organic molecule to a part of the metallic compound. Thus, the solvent can be stabilized. The content ratio of the metallic atom and a monomer of the polymer compound is preferably equal to or more than 1:1 and equal to or less than 1:5. The content ratio of the metallic atom and the organic molecule is preferably equal to or more than 1:1 and equal to or less than 1:6. At this time, the content number of a carbon atom in the insulating thin film is equal to or more than five times as large as that of the metallic atom. In addition, an elemental ratio in the insulating thin film can be measured by an element assay technique such as XPS (X-ray Photoelectron Spectroscopy). When a large volume of the metallic atom is mixed with the polymer compound or the organic molecule, the reactivity of the metallic compound becomes so fast that the insulating thin film become hardened rapidly. Thus, solubility and the insulating properties tend to be obtained insufficiently. Moreover, when a small volume of the metallic compound is mixed in the polymer compound or the organic molecule, an effect expected from the addition of metallic compound cannot be obtained. Thus, permittivity cannot be improved. The ultimate mixture of the metallic compound, the polymer compound and the organic molecule is preferred to be entirely solved in a solvent. When there is an insoluble matter, it is preferred to filter and remove the insoluble matter using a PTFE filter or the like. As the solvent in which the metallic compound, the polymer compound and the organic molecule are solved, it is required to arbitrarily select the solvent which corresponds to the respective properties such that an unexpected reaction may not be promoted. For example, water, alcohol or an organic solvent can be used. More particularly, water, methanol, ethanol, isopropanol, normal butanol, normal pentanol, normal hexanol, toluene, xylene, mesitylene, tetralin, anisole, acetylacetone, cyclopentanone, cyclohexanone, ethylene glycol, diethylene glycol, pentane, hexane, heptane, tetrahydrofuran or the like can be used. However, a usable solvent is not limited to these. The above mentioned solvent may be used either as a single solvent or as a solvent in which a plurality of solvents are mixed.

The insulating thin film in the embodiment of the present invention can be formed by drying or baking after coating or printing the above mentioned formation solution for the insulating thin film. As a particular method for forming the insulating thin film, an existing wet coating method such as a micro gravure coating, a dip coating, a screen coating, a die coating or a spin coating can be used. A baking temperature may be arbitrarily selected such that the used solvent can evaporate almost completely, the obtained thin film is not solved again and the thin film is sufficiently adhered to a substrate. When the substrate having heat resistance is used, the baking temperature can be preferably selected approximately from 60 to 250 degrees Celsius. When the substrate having low heat resistance such as a film substrate is used, a baking temperature can be preferably selected approximately from 60 to 200 degrees Celsius. Moreover, drying or baking can be performed under a vacuum condition.

The insulating thin film in the embodiment of the present invention may have a self-assembled monolayer on its surface.

As a compound which forms the self-assembled monolayer, a compound having a functional group such as a (mono, di, tri) alkoxysilane group, a (mono, di, tri) chlorosilane group, phosphonic acid, phosphine acid, phosphoric acid, phosphorous acid, hypophosphorous acid, an amino group, a halide group, calboxylic acid, a hydroxyl group, a thiol group, a disulfide group, an azide group, an acetylenic group, a vinyl group, a nitro group or a cyano group at the end and having a substituent group with equal to or more than 2 carbon atoms which includes at least any one of an alkyl group, a phenyl group, a phenoxy group, a thiophen ring, a pyrrole ring, a pyridine ring, a fluorene ring, ether, an ethylene group or an acetylenic group in a molecule can be exemplified. A host framework is preferred to be unbranched. For example, the desirable structure is a linear normal alkyl (n-alkyl) group, the ter-phenyl group in which three of phenyl groups are arranged in tandem or a structure having n-alkyl groups arranged on both sides of a para position of the phenyl group. In addition, ether binding may be included in alkyl chain. Also, a double bond or a triple bond between carbon and carbon may be included in the alkyl chain. The reactive substituent group of the molecules of the self-assembled monolayer interacts or reacts with a corresponding reactive part of the surface of the substrate. Then, a monolayer is formed on the substrate while the reactive substituent group and the substrate are bonded. The monolayer arranged on the substrate is the self-assembled monolayer. The more densely packing the molecules are filled with, the more uniform and smooth the surface of the self-assembled monolayer becomes. Hence, the host framework of the molecule preferably has a linear shape and the molecules preferably have the same length. Thus, a coverage of the self-assembled monolayer is preferably equal to or more than 90%.

Before the self-assembled monolayer 31 is formed, the surface processing such as a corona treatment, a plasma processing or an UV/ozone treatment can be performed on the surface of the gate insulating layer 30. By performing the surface processing on the surface of the insulating thin film of the present invention, hydroxyl group is able to be exposed, because binding of the oxygen and the metallic atom is broken in a part. Therefore, the self-assembled monolayer having more densely packing than that of the past becomes able to be formed on the gate insulating layer (the insulating thin film).

As a method for forming the self-assembled monolayer 31, a method for evaporating a compound which forms the self-assembled monomolecular on a corresponding substrate under a vacuum condition, a method for dipping the substrate in the solution of the compound or a Langmuir-Blodgett method can be used. However, a usable method is not limited to these. For example, as a method for surely forming the self-assembled monolayer 31 having densely packing by the compound, the methods described in Langmuir 19, 1159 (2003), J. Phys. Chem. B 110, 21101 (2006) and J. Am. Chem, Soc. 131, 9396 (2009) are preferably used.

The relative permittivity of the above mentioned insulating thin film in the embodiment of the present invention is preferred to be 3.9-6.0. When the relative permittivity of the insulating thin film is in the range of 3.9-6.0, a leak current does not occur. Thus, when the later describe insulating thin film is utilized for the field-effect transistor, excellent properties can be obtained.

Next, an embodiment in which the insulating thin film in the embodiment of the present invention is utilized for the field-effect transistor will be explained in detail.

FIGS. 3-6 are schematic cross sectional diagrams 100 showing a field-effect transistor of a first embodiment of the present invention. Each figure shows the field-effect transistor of a bottom gate structure in which a semiconductor 60, a source electrode 40 and a drain electrode are connected on the gate insulating layer 30. The field-effect transistor 100 in FIG. 3 has a structure in which the semiconductor 60 is sandwiched between the source electrode 40 and the drain electrode 50. The field-effect transistor 100 in FIG. 4 has a structure in which the source electrode 40 and the drain electrode 50 are separated and patterned on the semiconductor 60. The field-effect transistor 100 in FIG. 5 has a structure in which the self-assembled monolayer 31 is arranged between the gate insulating layer 30 and the semiconductor 60, and the self-assembled monolayer 31 and the semiconductor 60 are arranged between the source electrode 40 and the drain electrode 50. The field-effect transistor 100 in FIG. 6 has a structure in which the self-assembled monolayer 31 is arranged on the gate insulating layer 30, the semiconductor 60 is arranged on the self-assembled monolayer 31 and the source electrode 40 and the drain electrode 50 are separated and patterned on the semiconductor 60.

The field-effect transistor 100 in the embodiment of the present invention has a substrate 10, a gate electrode 20, a gate insulating layer 30, a source electrode 40, a drain electrode 50, a semiconductor 60 and a self-assembled monolayer 31 between the gate insulating layer 30 and the semiconductor 60, as shown in FIGS. 3-6

Figure 7:
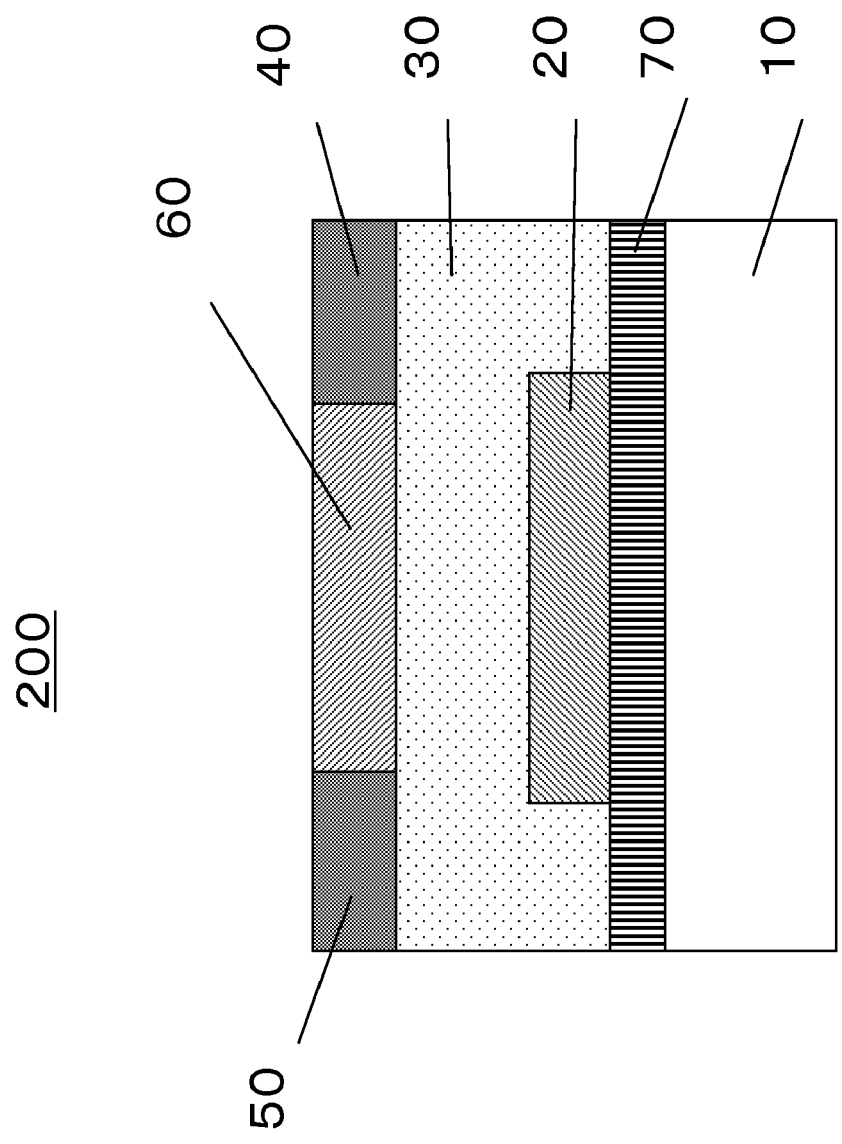
FIG. 7 is a schematic cross sectional diagram showing a field-effect transistor in a second embodiment of the present invention.
Figure 8:
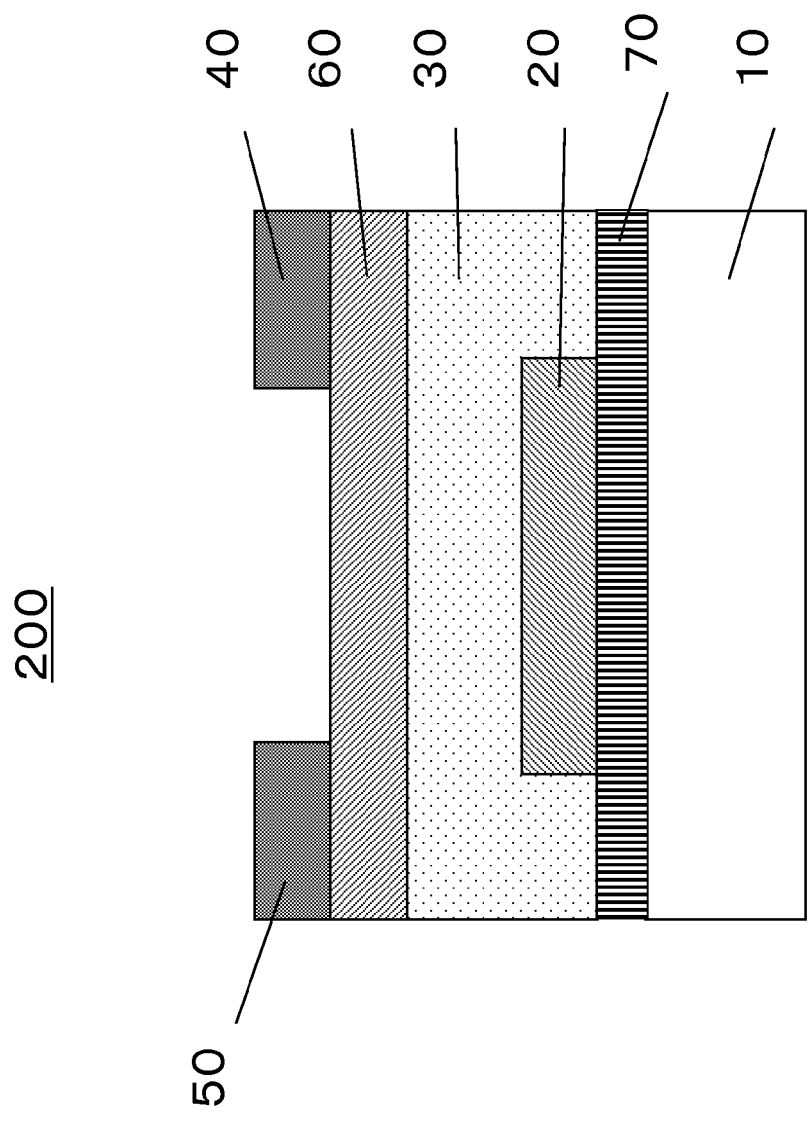
FIG. 8 is a schematic cross sectional diagram showing a field-effect transistor in a second embodiment of the present invention.
Figure 9:
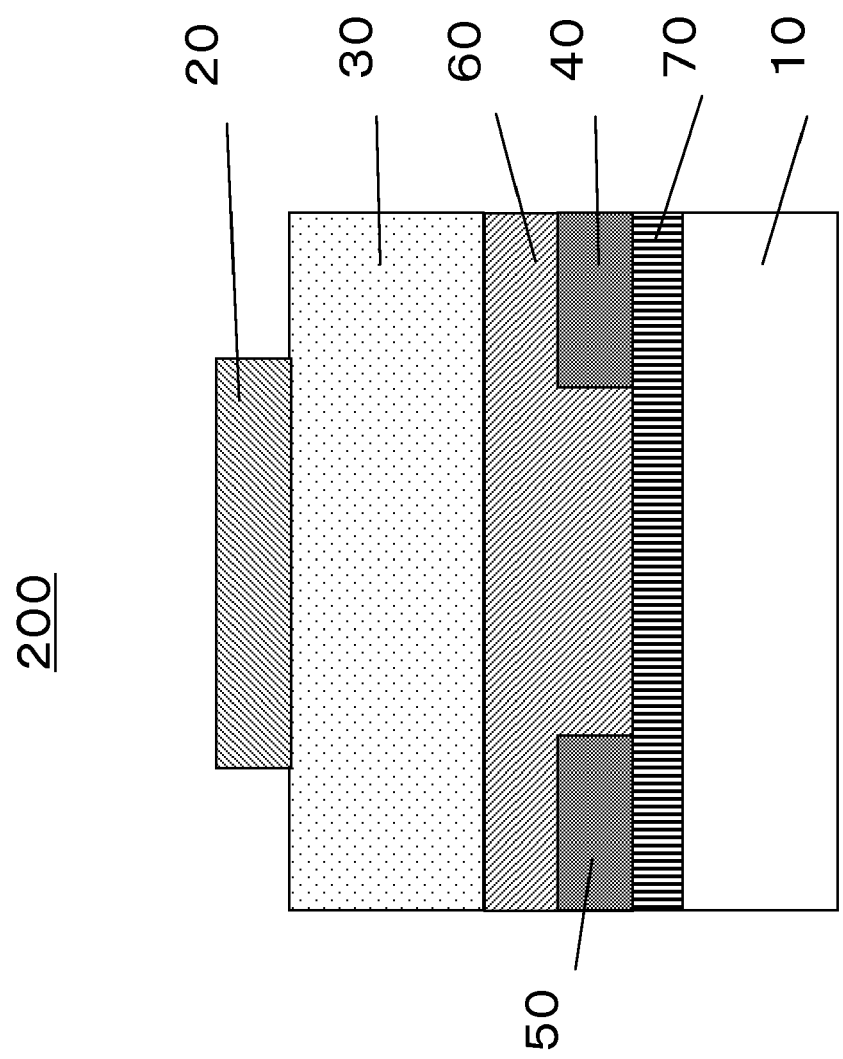
FIG. 9 is a schematic cross sectional diagram showing a field-effect transistor in a second embodiment of the present invention.

FIGS. 7-9 are schematic cross sectional diagrams showing a field-effect transistor 200 of a second embodiment of the present invention. As shown in FIGS. 7-9, the field-effect transistor 200 in the embodiment of the present invention has a substrate 10, an under-layer 70, a gate electrode 20, a gate insulating layer 30, a source electrode 40, a drain electrode 50 and a semiconductor 60. For example in FIGS. 7 and 8, the field-effect transistor 200 in the embodiment of the present invention has a bottom gate structure in which the semiconductor 60, the source electrode 40 and the drain electrode 50 are connected on the gate insulating layer 30. Above all, the field-effect transistor 200 in FIG. 7 is a bottom contact type where the semiconductor 60 is arranged between the source electrode 40 and the drain electrode 50. The field-effect transistor 200 in FIG. 8 is a top contact type where the source electrode 40 and the drain electrode 50 are separated and patterned on the semiconductor 60.

The field-effect transistor 200 in FIG. 9 has a top gate structure having the source electrode 40 and the drain electrode 50 where the semiconductor 60 is connected to the source electrode 40 and the drain electrode 50, the gate insulating layer 30 is arranged on the semiconductor 60 and the gate electrode 20 is stacked on the gate insulating layer 30. However, the structure of the field-effect transistor 200 in the embodiment of the present invention is not limited to the above mentioned structures and the field-effect transistor 200 can be adapted to any other structures.

The characteristic of the gate insulating layer 30 used for the field-effect transistor 100 in the embodiment of the present invention and the under-layer 70 used for the field-effect transistor 200 in the embodiment of the present invention is that both layers have a mixture of a polymer compound and a metallic compound, and the above mentioned insulating thin film of the present invention can be utilized for both layers. The mixture of the polymer compound and the metallic compound can be obtained as follows. Each precursor of the polymer compound and the metallic compound is solved in a solvent and reacted as described in the above explained coating solvent for the insulating thin film. Then, the mixture having binding between the framework of the polymer compound and the metal can be obtained. Reaction may be performed in the solvent before the gate insulating layer 30 and the under-layer 70 are formed, or may be performed by heating or drying after the gate insulating layer 30 and the under-layer 70 are formed by coating or printing.

As the substrate 10 of the field-effect transistor in the embodiment of the present invention, any sheet-like substrate having a uniform surface and insulating propeties on its surface can be used. For example, soda-lime glass, fused quartz, polyethylene terephthalate (PET), polyethylene naphthalate (PEN), cyclo olefin polymer, polyimide (PI), polyether sulfone (PES), polymethylmethacrylate (PMMA), polycarbonate (PC), polyarylate or the like can be used. Moreover, even a substrate having electrical conductivity or semiconductivity such as stainless sheet, aluminum foil, copper foil or silicon wafer can be used when it has insulating properties on its surface, for example, by coating or evaporating a polymer compound or a metal oxide on the surface of the substrate. Further, the above mentioned substrate 10 may have a surface processing layer such as an easy adhesion layer on its surface. Or, the surface processing such as a corona treatment, a plasma processing or an UV/ozone treatment can be performed on the substrate.

The gate electrode 20, the source electrode 40 and the drain electrode 50 of the field-effect transistor in the embodiment of the present invention can be formed by a photolithographic method or the like after a film of metal such as Al, Cr, Mo, Cu, Au, Pt, Pd, Fe, Mn or Ag is formed by a PVD method, a CVD (Chemical Vapor Deposition) method or a plating method. In addition, a transparent conducting material such as indium tin oxide (ITO), fluorine doped tin oxide (FTO), aluminum doped zinc oxide (AZO) or gallium doped zinc oxide (GZO), or an organic conducting material such as PEDOT:PSS, polyaniline or polythiophene can be used. When the above mentioned conducting material is used and has relatively high wiring resistance, it is preferred to decrease the resistance using a metal bus electrode. Moreover, the gate electrode, the source electrode and the drain electrode can be formed by coating by a printing method, and then, drying, baking, photo curing, aging or the like after the conducting materials such as the above mentioned metal, the transparent oxide or the organic conducting polymer compound, and precursors thereof are processed into a solution, paste, nanoparticle dispersion solution or the like.

The used printing method is not particularly limited. However, the printing method which can be used for patterning such as a relief printing method, an intaglio printing method, a planographic printing method, a reverse off-set printing method, a screen printing method, an ink-jet method, a thermal transfer printing method or a dispenser is preferably used, because the process can be simplified and speeded up and the cost can be reduced. In addition, the above described printing method can be combined with a photolithographic method such as a spin coating method, a die coating method, a micro gravure coating method or a dip coating method. Furthermore, the above described printing methods can be combined with one another.

As the gate insulating layer 30 of the field-effect transistor in the embodiment of the present invention, the above mentioned insulating thin film in the embodiment of the present invention can be used. In addition, a method for forming the gate insulating layer is as described above. Moreover, the insulating thin film in the embodiment of the present invention and the organic polymer compound can be stacked and utilized as the gate insulating layer. As a material used for stacking, an organic polymer compound such as polyvinyl phenol (PVP), polystyrene (PS), polymethylmethacrylate (PMMA), polyvinyl alcohol (PVA), polyvinyl chloride (PVC), polyvinylidene fluoride (PVDF), polytetrafluoroethylene (PTFE), polyimide (PI), epoxy resin, polydimethylsiloxane (PDMS) or butadiene rubber can be used. In addition, a mixture of the above mentioned materials or a mixture of the above mentioned material and of a compound having a reactive substituent group such as alkoxysilane group, vinyl group, acrylic acid ester, epoxy group can also be used. Further, oxide such as silicon oxide, titanium oxide, tantalum oxide, aluminum oxide, niobium oxide, zirconium oxide, copper oxide, nickel oxide, indium oxide or hafnium oxide can be used. In addition, a composite oxide of the above mentioned oxide, an oxide mixture or oxynitride can also be used. However, a usable material is not limited to these and any material which has sufficient insulating properties and capable of forming a thin film with a thickness of equal to or less than 1 μm can be used.

As a method for forming the gate insulating layer using the organic polymer compound, an existing wet coating method such as a micro gravure coating, a dip coating, a screen coating, a die coating or a spin coating can be used. In addition, as a method for forming an inorganic oxide, oxynitride or the like, a vacuum film-formation method such as a vacuum deposition method, a sputtering method, an ion plating method or CVD can be used. Moreover, plasma, an ion gun, a radical gun or the like in which arbitrary gas is utilized during a film-formation can be used in combination. In addition, the gate insulating layer can also be formed by reacting precursor which corresponds to each metal oxide, in particular, metallic halide of chloride or bromide, metallic alkoxide or metallic hydroxide with acid such as hydrochloric acid, sulfuric acid or nitric acid, or base of sodium hydroxide or potassium hydroxide, while the precursor hydrolyzes in alcohol or water. When a process having this kind of solution system is used, an existing wet coating method such as a micro gravure coating, a dip coating, a screen coating, a die coating or a spin coating can be utilized. The surface processing such as a corona treatment, a plasma processing or an UV/ozone treatment can be performed on the gate insulating layer 30. However, it is required to pay attention such that uniformity of the surface does not become rough by the surface processing. The surface of the gate insulating layer 30 is preferred to be relatively uniform without a pinhole, a projection and an undulation.

In addition, when materials which are not used for the insulating thin film of the present invention are used for the gate insulating layer 30, an inorganic material such as silicon oxide, silicon nitride, silicon oxynitride (SiNxOy), aluminum oxide, tantalum oxide, yttrium oxide, hafnium oxide, hafnium alminate, zirconium oxide or titanium oxide, polyacrylate such as PMMA (polymethylmethacrylate), or PVA (polyvinyl alcohol), PS (polystyrene), polyimide, polyester, epoxy resin, polyvinyl phenol (PVP), polyvinyl chloride (PVC), polyvinylidene fluoride (PVDF), polytetrafluoroethylene (PTFE), polydimethylsiloxane (PDMS) or butadiene rubber can be used. However, a usable material is not limited to these. A resistivity of the insulating material is preferably equal to or more than $10^{11}$ Ωcm, more preferably equal to or more than $10^{14}$ Ωcm in order to control a leak current of the gate. A film thickness of the gate insulating layer is preferably 50 nm-2 μm.

The gate insulating layer 30 in the embodiment of the present invention can be formed by a vacuum deposition method, an ion plating method, a sputtering method, a laser abrasion method, a plasma CVD method, a Photo-CVD method, a hotwire-CVD method, a spin coating method, a dip coating method, a screen printing method, a micro-gravure printing method or a die coating method. The gate insulating layer 30 may be used as a single layer or as a layer stacked by multilayer. In addition, a layer which has a composition sloping toward growth direction of the film is preferably used for the gate insulating layer 30.

The surface processing such as a corona treatment, a plasma processing or an UV/ozone treatment can be performed on the gate insulating layer 30. However, it is required to pay attention such that uniformity of the surface does not become rough by the surface processing. The surface of the gate insulating layer 30 is preferred to be relatively uniform without a pinhole, a projection and an undulation.

In addition, the field-effect transistor 100 in the embodiment of the present invention may have a self-assembled monolayer (not illustrated) at an interface between a semiconductor 60 and its under-layer. In other words, in the case of the field-effect transistor having the bottom gate structure shown in FIGS. 3 and 4, the self-assembled monolayer may be formed on the gate insulating layer 40. In the case of the field-effect transistor having the top gate structure shown in FIG. 9, the self-assembled monolayer may be formed on the under-layer 70.

As a method for forming the self-assembled monolayer, a method for evaporating a compound which forms the self-assembled monomolecular on a corresponding substrate under a vacuum condition, a method for dipping the substrate in the solvent of the compound or a Langmuir-Blodgett method can be used. However, a usable method is not limited to these. For example, as a method for surely forming the self-assembled monolayer having densely packing by the compound, the methods described in Langmuir 19, 1159 (2003), J. Phys. Chem. B 110, 21101 (2006) and J. Am. Chem, Soc. 131, 9396 (2009) are preferably used. By forming the self-assembled monolayer at the interface between the semiconductor 60 and its under-layer, wetting properties and the surface energy of the forming face of the semiconductor can be controlled and the field-effect transistor having excellent properties can be obtained.

Before the self-assembled monolayer is formed, the surface processing such as a corona treatment, a plasma processing or an UV/ozone treatment can be performed on the surface of the gate insulating layer 30 or the under-layer 70. In particular, in the case that the under-layer 70 and the semiconductor 60 are connected as in the field-effect transistor 200 in FIG. 9, by performing the surface processing on the under-layer 70, hydroxyl group is able to be exposed, because binding of oxygen and metallic atom is broken in a part. Therefore, the self-assembled monolayer having densely packing can be formed at the interface between the semiconductor 60 and the under-layer and the field-effect transistor 200 having excellent properties can be manufactured.

Figure 5:
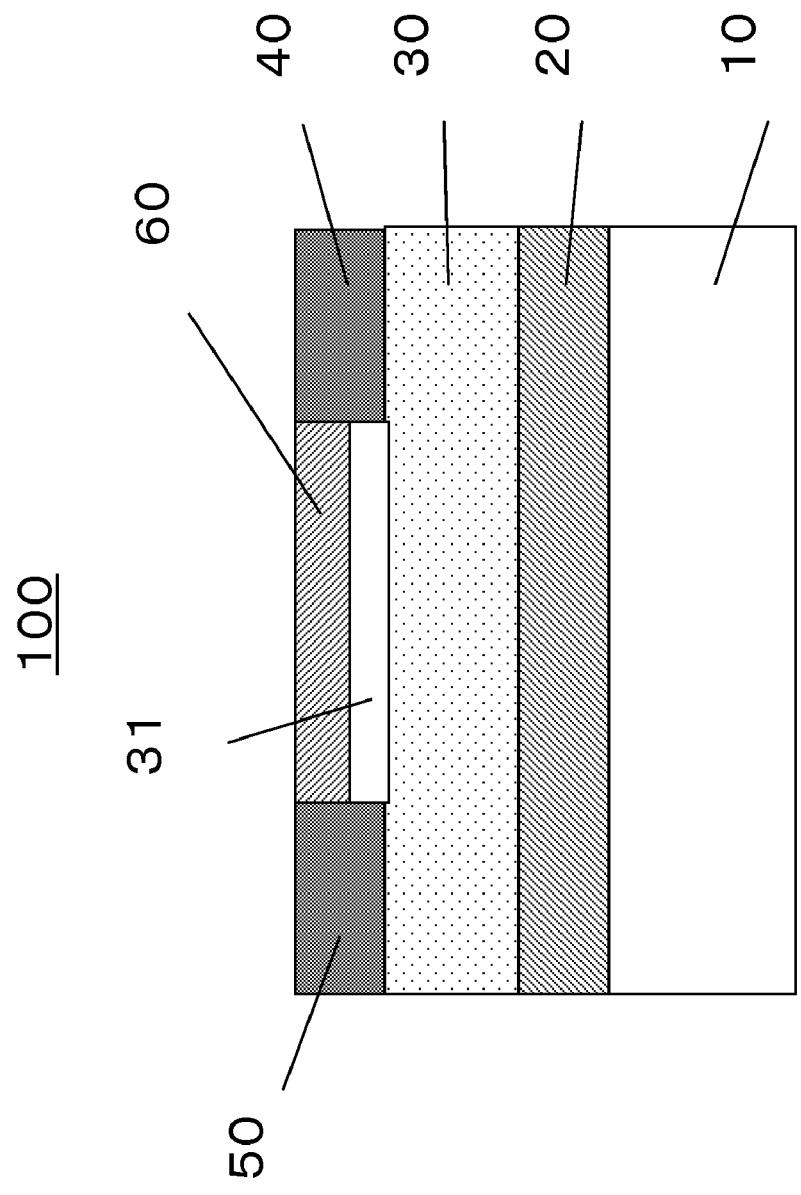
FIG. 5 is a schematic cross sectional diagram showing a field-effect transistor in a first embodiment of the present invention.
Figure 6:
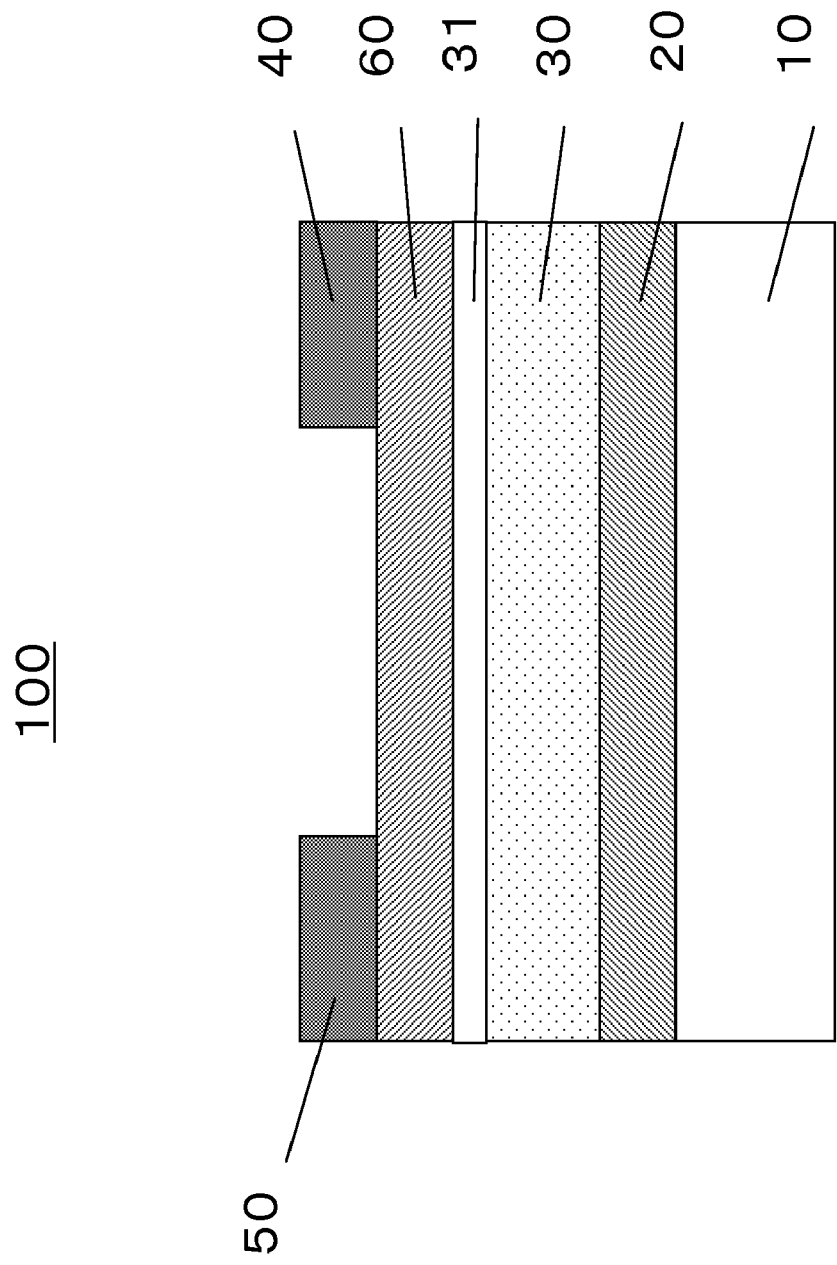
FIG. 6 is a schematic cross sectional diagram showing a field-effect transistor in a first embodiment of the present invention.

The self-assembled monolayer 31 is preferably formed on the gate insulating layer 30 of the field-effect transistor in the embodiment of the present invention as shown in FIGS. 5 and 6. By forming the self-assembled monolayer between the gate insulating layer and the semiconductor 60, the wetting properties and the surface energy of the surface of the gate insulating layer can be controlled and the field-effect transistor having excellent properties can be manufactured. As a method for forming the self-assembled monolayer, the above described methods can be used. The field-effect transistor having excellent properties can be obtained in the present invention, because the self-assembled monolayer having densely packing can be formed at the interface between the semiconductor 60 and the gate insulating layer in which the insulating thin film of the present invention is used.

As the semiconductor 60 used in the field-effect transistor in the embodiment of the present invention, a metal oxide semiconductor material or an organic semiconductor material is preferably used. As the metal oxide semiconductor material used for the semiconductor 60 in the embodiment of the present invention, oxide which includes at least one kind of an element out of zinc, indium, tin, tungsten, magnesium, and gallium such as zinc oxide, indium oxide, zinc indium oxide, tin oxide, tungsten oxide (WO) or indium gallium zinc oxide (In—Ga—Zn—O), can be exemplified. However, a usable material is not limited to these. These materials are substantially transparent. In addition, band gaps thereof are preferably equal to or more than 2.8 eV, more preferably, equal to or more than 3.2 eV. The structure of these materials can be any of single crystal, multicrystal, microcrystal, mixed crystal of crystal and of amorphous, nano-crystal embedded amorphous or amorphous. The thickness of the semiconductor 60 is preferably at least 20 nm.

The semiconductor 60 made of a metal oxide is formed by a sputtering method, a pulsed laser deposition method, a vacuum deposition method, a CVD method, MBE (fMolecular Beam Epitaxy) method or a sol-gel method. The sputtering method, a pulsed laser deposition method, a vacuum deposition method or a CVD method is preferably used. As the sputtering method, RFmagnetron sputtering and DC sputtering can be exemplified. As the vacuum deposition method, a heating deposition method, an electron beam deposition method and an ion plating method can be exemplified. As the CVD method, a hotwire CVD method and a plasma CVD method can be exemplified. However, a usable method is not limited to these.

As the organic semiconductor material used for the semiconductor 60 in the embodiment of the present invention, a n-conjugated organic polymer compound which has a semi-conductivity, for example, polypyrrol type, polythiophene type, polyaniline type, polyallylamine type, fluorene type, polycarbazole type, polyindole type or poly (p-phenylene vinylene) type, or a low molecular substance having n-conjugated series, for example, a polyaromatic derivative such as pentacene, a phthalocyanine derivative, a perylene derivative, a tetrathiafulvalene derivative, a tetracyanoquinodimethane derivative, fullerene type or carbon nanotube type can be used. However, a usable material is not limited to these. As a method for forming the organic semiconductor, a vacuum deposition method, a CVD method or a printing method in which a solvent is used can be exemplified. In terms of productivity, reduction in cost or the like, a method for coating a semiconductor material which can be solved in a solvent is preferably utilized.

When a printing method is utilized, a relief printing method, an intaglio printing method, a planographic printing method, a reverse off-set printing method, a screen printing method, an ink-jet method, a thermal transfer printing method, a dispenser, a spin coating method, a die coating method, a micro gravure coating method or a dip coating method can be used. Alternatively, the above described printing methods can be combined. However, a usable method is not limited to these.

The field-effect transistor in the embodiment of the present invention may further have a protective layer, an inter-layer insulating layer, and an upper pixel electrode. As the protective layer 107 and the inter-layer insulating layer, an organic polymer compound such as polyvinyl phenol (PVP), polystyrene (PS), polymethylmethacrylate (PMMA), polyvinyl alcohol (PVA), polyvinyl chloride (PVC), polyvinylidene fluoride (PVDF), polytetrafluoroethylene (PTFE), polyimide (PI), epoxy resin, polydimethylsiloxane (PDMS) or butadiene rubber can be used. In addition, a mixture of the above mentioned materials and a mixture of the above material and of a compound having a reactive substituent group such as alkoxysilane group, vinyl group, acrylic acid ester or epoxy group can also be used. Further, oxide such as silicon oxide, titanium oxide, tantalum oxide, aluminum oxide, niobium oxide, zirconium oxide, copper oxide, nickel oxide, indium oxide or hafnium oxide can be used. In addition, a composite oxide of the above mentioned oxide, an oxide mixture or oxynitride can also be used.

The field-effect transistors 100 and 200 in the embodiment of the present invention are explained above in detail along with a structure of one pixel. The field-effect transistor in the embodiment of the present invention has excellent properties, since it has excellent adhesive properties and high solvent resistance to a processing solvent used in the manufacturing process such as strong acid or strong base. In addition, the field-effect transistor 100 in the embodiment of the present invention can be preferably used as a pixel lighting device of an image display unit by arranging the pixels in an array shape, since the field-effect transistor has high insulating properties and permittivity. Moreover, in the field-effect transistor 200 in the second embodiment of the present invention, the reliable field-effect transistor can be manufactured even when a flexible substrate such as a plastic film is used, because an adhesion between the substrate and the transistor can be improved.

Figure 10:
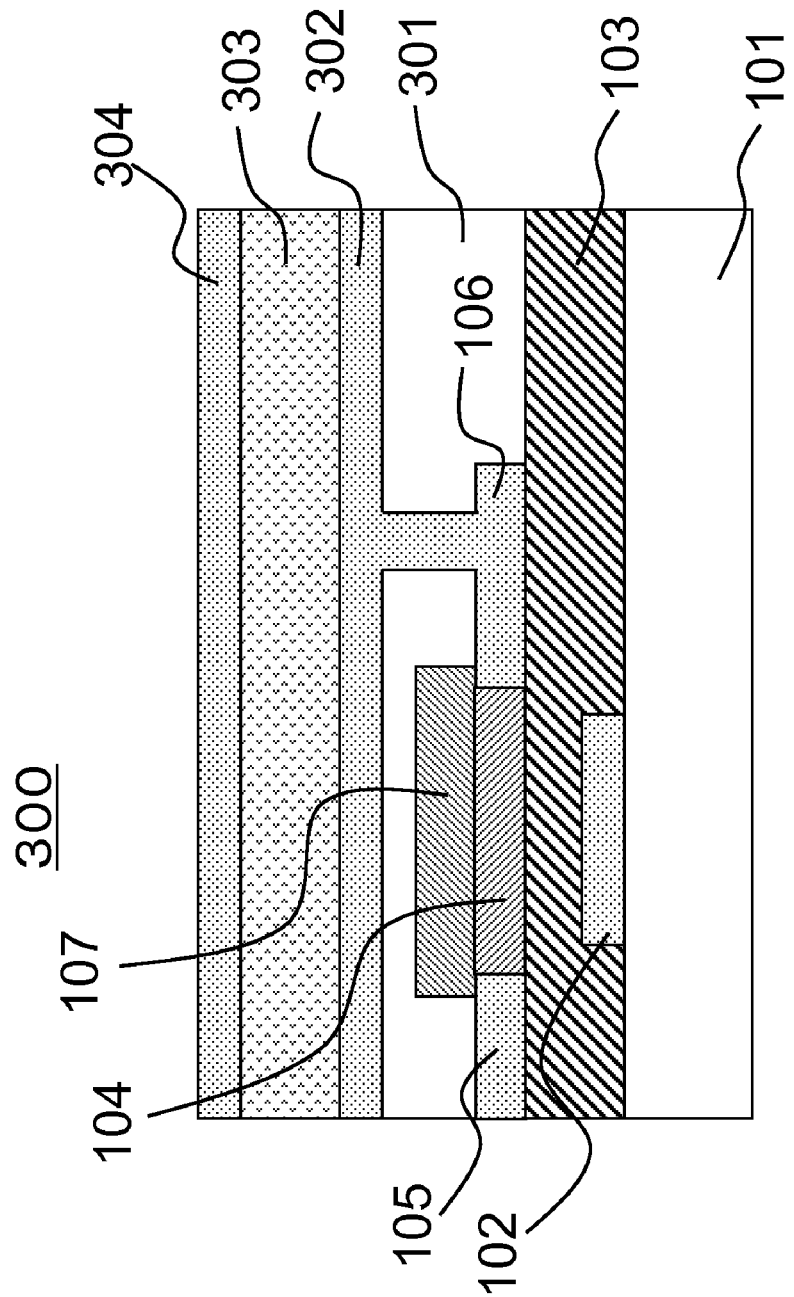
FIG. 10 is a schematic cross sectional diagram showing an image display unit in an embodiment of the present invention.
Figure 11:
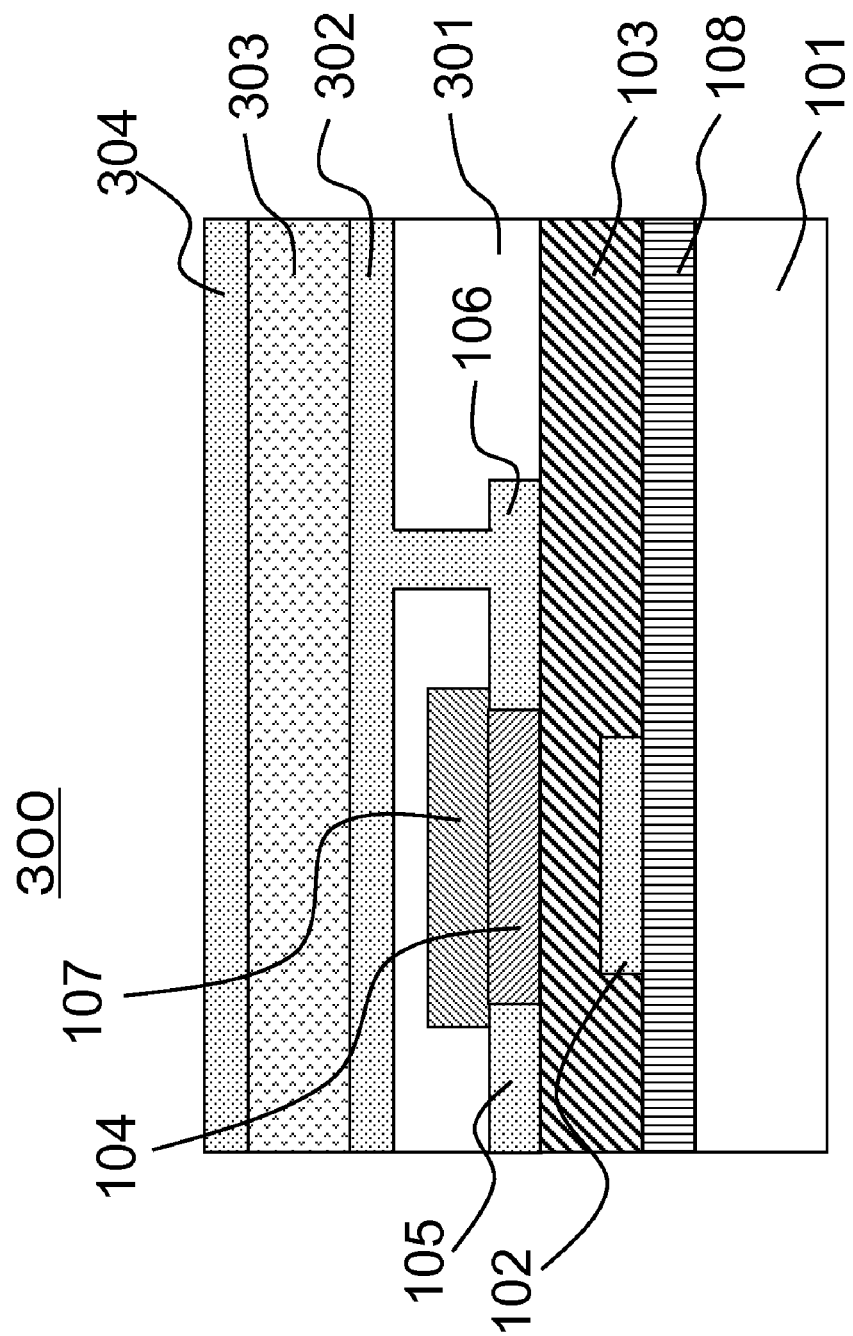
FIG. 11 is a schematic cross sectional diagram showing an image display unit in an embodiment of the present invention.

FIGS. 10 and 11 are examples of an image display unit 300 in which the field-effect transistor of the present invention is employed as a pixel lighting device. The image display unit of the present invention has a field-effect transistor array in which the at least one field-effect transistor of the above is arranged on each pixel and connected to an image display medium 303. As an example of the image display medium, an electrophoretic display medium (electronic paper), a liquid crystal display medium, an OLED or an inorganic light emitting diode is used.

In an example of the image display unit of the present invention shown in FIG. 10, an inter-layer insulating layer 301 is formed on a substrate 101 having the field-effect transistor, a source electrode 105 or a drain electrode 106 is connected to a pixel electrode 302 and an image display medium 303 is sandwiched between the pixel electrode 302 and a counter electrode 304. The field-effect transistor of the present invention can be transparent depending on its material. Therefore, a display image can be seen from either the counter electrode side or the field-effect transistor side. As shown in the example of the image display unit of FIG. 10, the pixel electrode 302 can be arranged on the entire surface of the inter-layer insulating layer 301. An electrophoretic image medium on which, for example, the counter electrode 304 is formed is adhered thereon. Then, the image display unit can be manufactured.

In the example of an image display unit of FIG. 11, the field-effect transistor in the second embodiment of the present invention is applied and the under-layer 108 is formed on the entire surface of the substrate 101 which is the side where the transistor is formed.

As another example of the image display unit of the present invention, a structure in which a partition wall sectioning the pixel is formed on the field-effect transistor and the image display medium is formed on the pixel electrode 302 which is extended from the source electrode 105 or the drain electrode 106 can be exemplified. For example, an organic electroluminescence formed by an ink jet method or a printing method can be used as the display medium.

According to the present invention, the insulating thin film is cross-linked by bonding a polymer compound to a metallic atom through oxide or nitrogen atom. Therefore, the insulating thin film has high insulating properties, solvent resistance and permittivity. Further, a formation solution for the insulating thin film can be used for coating at low temperature. The present invention provides the field-effect transistor having excellent properties by using the insulating thin film as a gate insulating layer, a method for manufacturing thereof and the image display unit in which the field-effect transistor is employed.

In addition, in another embodiment of the present invention, when the insulating thin film is used as an under-layer of a substrate, adhesion between the substrate and the field-effect transistor is chemically improved and the field-effect transistor is not peeled from a plastic substrate by dipping in strong acid or strong base used in a photolithography process.

Hence, the present invention can provide the field-effect transistor in an excellent reproducible manufacturing process, a method for forming thereof and the image display unit.

EXAMPLES

The present invention will be exampled in detail by particular examples as follows. However, the examples are for explaining the present invention and the present invention is not limited to the examples.

Example 1

1 g of Tetra-n-butyl titanate (($^n$BuO)$_4$Ti) as a metallic compound, 1.5 g of polyvinyl phenol (PVP) as a polymer compound and 2 g of methylolmelamine as an organic molecule were respectively solved in n-butanol, toluene/n-butanol and toluene/n-butanol. Moreover, the above materials were mixed by dipping carefully while they were stirred under an Ar atmosphere. Thus, an orange colored solvent was obtained. Furthermore, the formation solution for the insulating thin film was obtained as a transparent orange colored solvent by putting the obtained orange colored solvent through a PTFE filter with pore sizes of 0.2 μm.

2 ml of the formation solution for the insulating thin film was spin coated on a glass substrate, dried at 90 degrees Celsius for 10 minutes and baked at 120 degrees Celsius for 1 hour. Thus, the insulating thin film with a thickness of 800 nm was obtained.

The obtained insulating thin film was analyzed by XPS. The inside of the insulating thin film was analyzed by etching for 10 seconds using Ar ion beam. The content ratio of titanium and PVP monomer was 1:5 and the content ratio of titanium and methylol melamine was 1:2. In addition, the content ratio of titanium atom and carbon atom was 1:30.

The insulating properties and permittivity of the obtained insulating thin film were measured by forming aluminum electrodes having 1 cm square above and under the insulating thin film. When 60V was applied to one electrode, the resistivity obtained from a flowing current value was $2 \times 10^{14}$ Ω·cm.

In addition, capacitance was measured by a LCR meter with 75 kHz frequency. Then, permittivity determined from the capacitance was 4.5, thus, high insulating properties and relative permittivity were obtained.

Example 2

A self-assembled monolayer 31 made of octadecyltrichlorosilane (OTS) was formed on the surface of the insulating thin film obtained in Example 1. First, the surface processing was performed for 5 minutes on the insulating thin film of Example 1 using a UV/ozone irradiation device and the surface had hydrophilic properties. The obtained contact angle of pure water on the surface was 5.4°. Furthermore, the insulating thin film having hydrophilic properties on its surface was dipped for one night in a dry toluene solvent of OTS. Thus, the self-assembled monolayer 31 was obtained. The contact angle of pure water of the surface of the obtained self-assembled monolayer 31 was 103°. The surface was observed using AFM (Atomic Force Microscope), then, a coverage of OTS was 100%.

Example 3

1 g of a solvent having diisopropoxybis titanium (triethanolaminato) at 80% as a metallic compound, 1 g of polyvinyl alcohol (PVA) as a polymer compound and 2 g of 3-amino-1,2,4-triazole as an organic molecule were respectively solved in water. Moreover, the above materials were mixed by dipping carefully while they were stirred under an Ar atmosphere. Thus, a colorless solvent was obtained. Furthermore, the formation solution for the insulating thin film was obtained as a transparent solvent by putting the obtained colorless solvent through a PTFE filter with pore sizes of 0.2 μm.

2 ml of the obtained formation solution for the insulating thin film was spin coated on a glass substrate, dried at 90 degrees Celsius for 10 minutes and baked at 150 degrees Celsius for 1 hour. Thus, the insulating thin film with a thickness of 1000 nm was obtained.

The obtained insulating thin film was analyzed by XPS. The inside of the insulating thin film was analyzed by etching for 10 seconds using Ar ion beam. The content ratio of titanium and PVA monomer was 1:4 and the content ratio of titanium and 3-amino-1,2,4-triazole was 1:3. In addition, the content ratio of titanium atom and carbon atom was 1:20.

The insulating properties and permittivity of the obtained insulating thin film were measured by forming aluminum electrodes having 1 cm square above and under the insulating thin film. When 60V was applied to one electrode, obtained from a flowing current value was $2 \times 10^{14}$ Ω·cm. In addition, capacitance was measured by a LCR meter with 75 kHz frequency. Then, permittivity determined from the capacitance was 4.8, thus, high insulating properties and relative permittivity were obtained.

Example 4

A self-assembled monolayer 31 of octadecyltrichlorosilane (OTS) was formed on the surface of the insulating thin film obtained in Example 3.

First, the surface processing was performed for 5 minutes on the insulating thin film of Example 3 using a UV/ozone irradiation device and the surface had hydrophilic properties. A contact angle of pure water on the obtained surface was 4.5°. Furthermore, the insulating thin film having hydrophilic properties on its surface was dipped for a night in a dry toluene solvent of OTS. Thus, the self-assembled monolayer 31 was obtained. A contact angle of pure water of the obtained self-assembled monolayer was 102°. The surface was observed using AFM (Atomic Force Microscope), then, a coverage of OTS was 100%.

Example 5

1 g of Tetra-n-butylzirconate ((″BuO)$_4$Zr) as a metallic compound, 1.5 g of polyvinyl phenol (PVP) as a polymer compound and 2 g of methylolmelamine as an organic molecule were mixed as in Example 1. Thus, a formation solution for an insulating thin film was obtained as a transparent solvent.

The insulating properties and permittivity of the obtained insulating thin film were measured by forming aluminum electrodes which has 1 cm square above and under the insulating thin film. When 60V was applied to one electrode, the resistivity obtained from a flowing current value was $2 \times 10^{14}$ Ω·cm. In addition, capacitance was measured by a LCR meter with 75 kHz frequency. Then, permittivity determined from the capacitance was 4.0, thus, high insulating properties and relative permittivity were obtained.

Example 6

Figure 3:
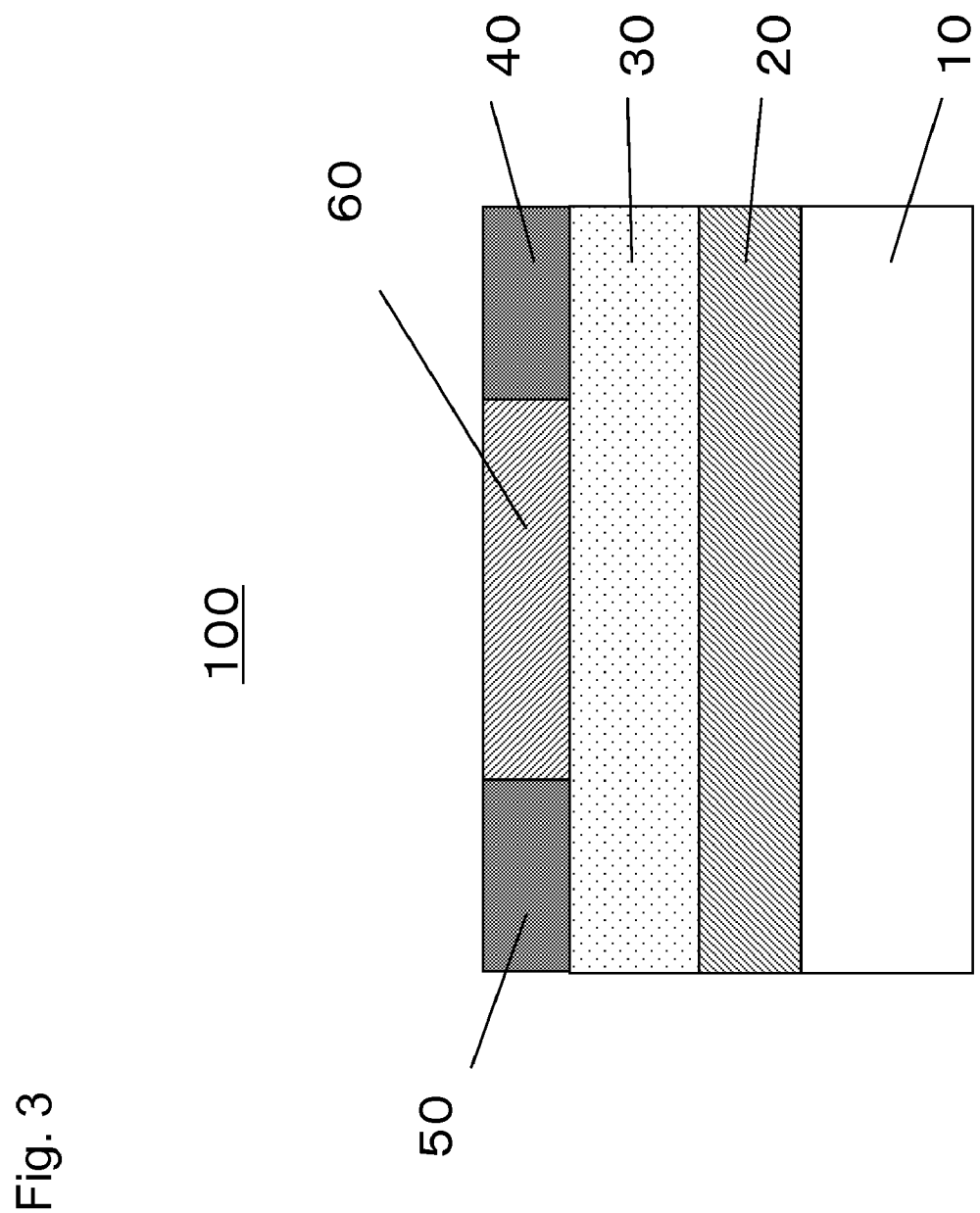
FIG. 3 is a schematic cross sectional diagram showing a field-effect transistor in a first embodiment of the present invention.
Figure 4:
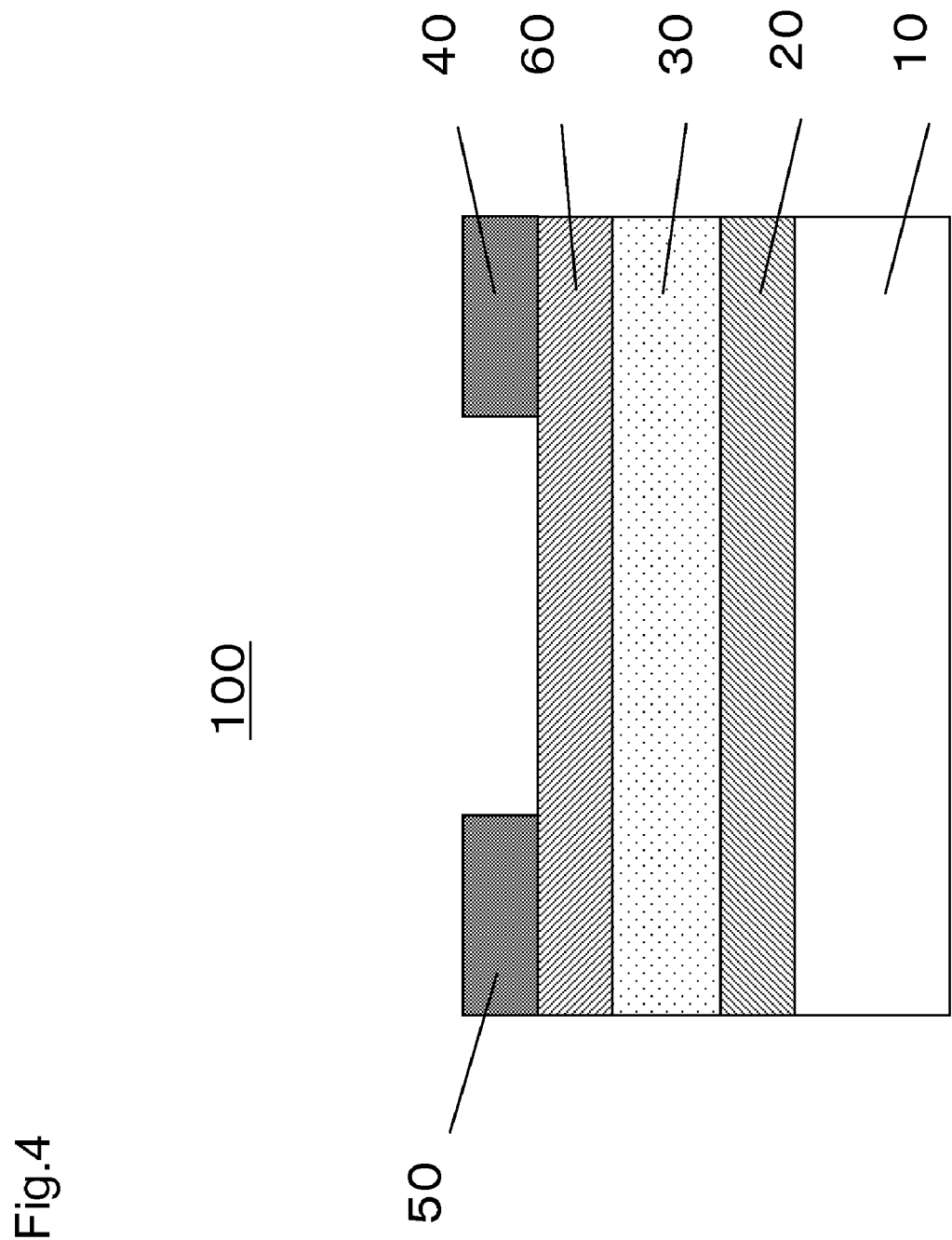
FIG. 4 is a schematic cross sectional diagram showing a field-effect transistor in a first embodiment of the present invention.

The field-effect transistor 100 shown in FIG. 3 was manufactured. A glass with a thickness of 0.7 mm was used as an insulating substrate 10 and after aluminum as a gate electrode 20 was formed so as to have a thickness of 50 nm by a vacuum deposition method, the gate electrode was patterned by etching and a photolithographic method. Next, the insulating thin film obtained in Example 1 was stacked as a gate insulating layer 30 and a film of gold was formed so as to have a thickness of 50 nm by a vacuum deposition method. Then, electrode patterns which become a source electrode 40 and a drain electrode 50 were formed by etching and a photolithographic method. At this time, before gold was deposited, chrome with a thickness of approximately 3 nm was stacked in order to improve an adhesion between gold and the gate insulating layer 30.

Next, poly (3-hexylthiophene) (P3HT) as a semiconductor 60 was coated by flexographic printing and the semiconductor 60 was formed by drying at 120 degrees Celsius for 30 minutes. Thus, the field-effect transistor 100 was obtained.

Transmission characteristics of the obtained field-effect transistor 100 were measured by a gate voltage of from −20V to 40V and a source voltage of −40V. Then, mobility was 0.014 cm$^2$/Vs, on/off was $10^5$ and a threshold voltage was −2V.

Example 7

The field-effect transistor 100 shown in FIG. 3 was manufactured. Polyethylene naphthalate (PEN) with a thickness of 150 μm was used as an insulating substrate 10 and a gate electrode 20 made of aluminum was formed so as to have a thickness of 50 nm by a vacuum deposition method. Thereafter, the gate electrode was patterned by etching and a photolithographic method. Next, the insulating thin film obtained in Example 3 was stacked as a gate insulating layer 30 and a film of gold was formed so as to have a thickness of 50 nm by a vacuum deposition method. Then, electrode patterns which become a source electrode 40 and a drain electrode 50 were formed by etching and a photolithographic method. At this time, chrome with a thickness of approximately 3 nm was stacked before gold was deposited in order to improve an adhesion between gold and the gate insulating layer 30.

Next, a film of poly (6,13-bis (triisopropylsilylethynyl) pentacene) (TIPS-pentacene) as a semiconductor 60 was coated by flexographic printing and the semiconductor was formed by drying at 90 degrees Celsius for 30 minutes. Thus, the field-effect transistor 100 was obtained.

Transmission characteristics of the obtained field-effect transistor 100 were measured by a gate voltage of from −20V to 40V and a source voltage −40V. Mobility was 0.7 cm$^2$/Vs, on/off was $10^6$ and a threshold voltage was −1V.

Example 8

The field-effect transistor 100 shown in FIG. 6 was manufactured. A glass with a thickness of 0.7 m was used as an insulating substrate 10 and a gate electrode 20 made of aluminum was formed so as to have a thickness of 50 nm by a vacuum deposition method. Thereafter, the gate electrode was patterned by etching and a photolithographic method. Next, the insulating thin film obtained in Example 5 was stacked as a gate insulating layer 30 and the self-assembled monolayer 31 made of OTS was formed as in Example 2. Then, pentacene was deposited as the semiconductor 60 at 60 degrees Celsius such that a film thickness of the semiconductor is 40 nm. Next, a film of gold was formed so as to have a thickness of 50 nm by a vacuum deposition method after a mask corresponding to electrode patterns which are the source electrode 40 and the drain electrode 50 covered the semiconductor.

Thus, the field-effect transistor 100 was obtained.

Transmission characteristics of the obtained field-effect transistor 100 were measured by a gate voltage of from −20V to 40V and a source voltage of −40V. Mobility was 2.5 cm$^2$/Vs, on/off was 10$^8$ and a threshold voltage was −6V.

Comparative Example 1

1 g of Tetra-n-butyl titanate (("BuO)$_4$Ti) as a metallic compound and 1.5 g of polyvinyl phenol (PVP) as a polymer compound were respectively solved in n-butanol and toluene/n-butanol. Moreover, the above materials were mixed by dipping carefully while they were stirred under an Ar atmosphere. Thus, an orange colored precipitate was obtained. The obtained precipitate was continuously stirred for another day. However, the precipitate was not solved in the solvent and remained as the precipitate without becoming a solution state. Then, the insulating thin film could not be formed.

Comparative Example 2

Tetra-n-butylzirconate (("BuO)$_4$Zr) was used as a metallic compound in Comparative Example 2. Then, a white colored precipitate was obtained. However, the precipitate did also not become a solution state and the insulating thin film could not be obtained.

Comparative Example 3

As shown in FIG. 3 as well as in Example 6, on a substrate 10, a gate electrode 20, a gate insulating layer 30, a source electrode 40 and a drain electrode 50 were formed. For a material of the gate insulating layer 30, a mixture having 10:1 of PVP and methylolmelamine was used. A resistivity was 5×10$^{14}$ Ω·cm. Relative permittivity was 3.8. Next, the semiconductor 60 was formed in the same way shown in Example 6 and the field-effect transistor was obtained.

Transmission characteristics of the obtained field-effect transistor 100 were measured by a gate voltage of from −20V to 40 and a source voltage of −40V. Mobility was 0.006 cm$^2$/Vs, on/off was 10$^4$ and a threshold voltage was +3V.

The field-effect transistor 100 in the examples and comparative examples are compared. In the examples, the field-effect transistor 100 without degradation in properties could be manufactured, because the gate insulating layer 30 which is the insulating thin film having high insulating properties and permittivity is used in the field-effect transistor 100.

Example 9

Next, in Examples 9-12 and Comparative Examples 4 and 5, the insulating thin film of the present invention was used as an under-layer 70 on the substrate, and the obtained characteristics were observed.

First, as a solvent for the under-layer, 1 g of Tetra-n-butyl titanate (("BuO)$_4$Ti) as a metallic compound, 1.5 g of polyvinyl phenol (PVP) as a polymer compound and 2 g of methylolmelamine as an organic molecule were respectively solved in n-butanol, toluene/n-butanol and toluene/n-butanol. Moreover, the above materials were mixed by dipping carefully while they were stirred under an Ar atmosphere. Thus, an orange colored solvent was obtained. Furthermore, a transparent orange colored solvent was obtained by putting the obtained orange colored solvent through a PTFE filter with pore sizes of 0.2 μm.

Next, 2 ml of the obtained solvent was spin coated on a PET substrate and a glass substrate, dried at 90 degrees Celsius for 10 minutes and baked at 120 degrees Celsius for 1 hour. Thus, the thin film with a thickness of 200 nm (an under-layer 70) was obtained. Before coating the solvent, the surfaces of the glass substrate and the PET substrate were washed for 5 minutes using a UV/ozone washing machine.

The glass substrate and PET substrate on which the obtained thin film was formed were dipped for 30 minutes in an aqueous solution having tetramethylammonium hydroxide at 2.38%. Then, the thin film was not peeled.

The obtained thin film was analyzed by XPS. The inside of the thin film was analyzed by etching for 10 seconds using Ar ion beam. The content ratio of titanium and PVP monomer was 1:3 and the content ratio of titanium and methylol melamine was 1:2.

Example 10

First, as a solvent for an under-layer, 1 g of Tetra-n-butyl titanate (("BuO)$_4$Ti) as a metallic compound, 1 g of polyvinyl phenol (PVP) as a polymer compound and 2 g of methylolmelamine as an organic molecule were respectively solved in n-butanol, toluene/n-butanol and toluene/n-butanol. Furthermore, a butanol solvent having 1 g of tetrabutylsilicate was prepared and the above described materials were mixed with the solvent by dipping carefully while they were stirred under an Ar atmosphere. Thus, an orange colored solvent was obtained. Furthermore, the transparent orange colored solvent was obtained by putting the obtained orange colored solvent through a PTFE filter with pore sizes of 0.2 μm.

Next, 2 ml of the obtained solvent was spin coated on the PET substrate and the glass substrate, dried at 90 degrees Celsius for 10 minutes and baked at 120 degrees Celsius for 1 hour. Thus, the thin film with a thickness of 200 nm (an under-layer 70) was obtained. Before coating the solvent, the surfaces of the glass substrate and PET substrate were washed for 5 minutes using a UV/ozone washing machine.

The glass substrate and PET substrate on which the obtained thin film was formed were dipped for 30 minutes in an aqueous solution having tetramethylammonium hydroxide at 2.38%. Then, the thin film was not peeled.

The obtained thin film was analyzed by XPS. The inside of the thin film was analyzed by etching for 10 seconds using Ar ion beam. The content ratio of titanium and PVP monomer was 1:3. The content ratio of titanium and silicon was 1:1. The content ratio of titanium and methylol melamine was 1:2.

Example 11

First, as a solvent for an under-layer 70, 1.5 g of a solvent having diisopropoxybis titanium (triethanolaminato) at 80% as a metallic compound, 1 g of polyvinyl alcohol (PVA) as a polymer compound and 2 g of 3-amino-1,2,4-triazole as an organic molecule were respectively solved in water. Moreover, the above materials were mixed by dipping carefully while they were stirred under an Ar atmosphere. Thus, a colorless solvent was obtained. Furthermore, a transparent solvent was obtained by putting the obtained colorless solvent through a hydrophilic PTFE filter with pore sizes of 0.2 μm.

Next, 2 ml of the obtained solvent was spin coated on the PET substrate and the glass substrate, dried at 90 degrees Celsius for 10 minutes and baked at 150 degrees Celsius for 1 hour. Thus, the thin film with a thickness of 100 nm (an under-layer 70) was obtained. Before coating the solvent, the surfaces of the glass substrate and PET substrate were washed for 5 minutes using a UV/ozone washing machine.

The glass substrate and PET substrate on which the obtained thin film was formed were dipped for 30 minutes in an aqueous solution having tetramethylammonium hydroxide at 2.38%. Then, the thin film was not peeled.

The obtained thin film was analyzed by XPS. The inside of the thin film was analyzed by etching for 10 seconds using Ar ion beam. The content ratio of titanium and PVA monomer was 1:2. The content ratio of titanium and 3-amino-1,2,4-triazole was 1:3.

Example 12

First, as a solvent for an under-layer, 1 g of tetrabutyl zirconate as a metallic compound, 1 g of polyvinyl phenol (PVP) as a polymer compound and 3 g of methylolmelamine as an organic molecule were respectively selected and mixed as in Example 9. Then, a transparent solvent was obtained.

Next, 2 ml of the obtained solvent was spin coated on the PET substrate and the glass substrate, dried at 90 degrees Celsius for 10 minutes and baked at 150 degrees Celsius for 1 hour. Thus, a thin film with a thickness of 100 nm (an under-layer 70) was obtained. Before coating the solvent, the surfaces of the glass substrate and PET substrate were washed for 5 minutes using a UV/ozone washing machine.

The glass substrate and PET substrate on which the obtained thin film was formed were dipped for 30 minutes in an aqueous solution having tetramethylammonium hydroxide at 2.38%. Then, the thin film was not peeled.

The obtained thin film was analyzed by XPS. The inside of the thin film was analyzed by etching for 10 seconds using Ar ion beam. The content ratio of zirconium and PVP monomer was 1:3. The content ratio of zirconium and methylolmelamine was 1:3.

Example 13

The field-effect transistor 200 having the same structure shown in FIG. 8 was manufactured. As a substrate 10, PEN with a thickness of 125 μm was used. After one side of the surface of PEN was washed for 5 minuets using a UV/ozone wash, the solvents for the under-layer 70 manufactured in Examples 9-12 were respectively coated by a spin coating method and baked at 150 degrees Celsius for 1 hour. Thus, the under-layer 70 with a thickness of 100 nm was each formed.

Next, a gate electrode 20 made of aluminum was formed on the under-layer 70 so as to have a thickness of 50 nm by a vacuum deposition method. Thereafter, the gate electrode was patterned by etching and a photolithographic method. Next, a film of SiON was formed so as to have a thickness of 350 nm as a gate insulating layer 30 by RF sputtering, using a silicon nitride ($Si_3N_4$) target such that the gate insulating layer 30 could cover the gate electrode 20. Then, a film of amorphous In—Ga—Zn—O was formed so as to have a thickness of 15 nm as a semiconductor 60 by RF sputtering, using a $InGaZnO_4$ target.

Next, a resist was coated on the semiconductor 60. Then, the resist was dried and developed. Thereafter, a film of ITO with a thickness of 50 nm was formed by DC magnetron sputtering as a source electrode 50 and a drain electrode 60, performing a liftoff.

Transmission characteristics of the obtained field-effect transistor 200 were measured by a gate voltage of from 20V to −20V and a drain voltage of 15V. Mobility was 3.4 $cm^2$/Vs-82 $cm^2$/Vs, on/off was approximately $10^5$ and a threshold voltage was from −2V to −5V.

Each film was not peeled under a photolithographic process and the reproducible field-effect transistor 100 was manufactured.

Example 14

The field-effect transistor 200 having the same structure shown in FIG. 7 was manufactured. As a substrate 10, PEN with a thickness of 125 μm was used. After one side of the surface of PEN was washed for 5 minuets using a UV/ozone wash, the solvents for the under-layer 70 manufactured in Examples 1-4 were respectively coated by a spin coating method and baked at 150 degrees Celsius for 1 hour. Thus, the under-layer 70 with a thickness of 100 nm was each formed.

Next, a film of aluminum was formed so as to have a thickness of 50 nm as a gate electrode 20 on the under-layer 70 by a vacuum deposition method. Thereafter, the gate electrode was patterned by etching and a photolithographic method. Next, a film of SiON was formed so as to have a thickness of 350 nm as a gate insulating layer 30 by RF sputtering, using a silicon nitride ($Si_3N_4$) target such that the gate insulating layer 30 can cover the gate electrode 20.

Next, a resist was coated on the gate insulating layer 30. After the resist was dried and developed, the films of titanium and gold were respectively and continuously formed by a vacuum deposition method using an electron beam so as to have a thickness of 5 nm and 50 nm respectively. Thereafter, the films were patterned and formed as a source electrode 50 and a drain electrode by a liftoff.

Next, a self-assembled monolayer (not illustrated) made of octadecyltrimethoxysilane (OTS) was formed on the surface of the gate insulating layer 40 by CVD method. Then, the semiconductor 60 was formed by depositing pentacene at 60 degrees Celsius so as to have a thickness of 40 nm. Thus, the field-effect transistor 200 was obtained.

Transmission characteristics of the obtained field-effect transistor 200 were measured by a gate voltage of from 20V to −20V and a drain voltage of −15V. Mobility was 0.85 $cm^2$/Vs-1.2 $cm^2$/Vs, on/off was approximately $10^5$ and a threshold voltage was from −6V to −2V.

Each film was not peeled under a photolithographic process and the reproducible field-effect transistor 200 was manufactured.

Comparative Example 4

A mixture having 10:1 of PVP and methylolmelamine was solved in a cyclohexanone solvent. 2 ml of the obtained solvent was spin coated on a glass substrate and a PET substrate, dried at 90 degrees Celsius for 10 minutes and baked at 90 degrees Celsius for 1 hour. Thus, a thin film with a thickness of 200 nm was obtained. Before coating the solvent, the surfaces of the glass substrate and the PET substrate were washed for 5 minutes using a UV/ozone washing machine.

The glass substrate and PET substrate on which the obtained thin film was formed were dipped for 15 minutes in an aqueous solution having tetramethylammonium hydroxide at 2.38%. Then, the thin film was peeled.

Comparative Example 5

A mixture having 1 g of PVP and 1 g of methylolmelamine was solved in a cyclohexanone solvent. Further, a butanol solvent having 1 g of tetrabutylsilicate was prepared. Then, the materials were mixed by dipping carefully while they were stirred under an Ar atmosphere.

2 ml of the obtained solvent was spin coated on a glass substrate and a PET substrate, dried at 90 degrees Celsius for 10 minutes and baked at 180 degrees Celsius for 1 hour. Thus, a thin film with a thickness of 100 nm was obtained. Before coating the solvent, the surfaces of the glass substrate and the PET substrate were washed for 5 minutes using a UV/ozone washing machine.

The glass substrate and PET substrate on which the obtained thin film was formed were dipped for 15 minutes in an aqueous solution having tetramethylammonium hydroxide at 2.38%. Then, the thin film was peeled.

The field-effect transistor 200 in examples and comparative examples are compared. By forming the under-layer 70 on the substrate 10, adhesion can be chemically improved and the reproducible field-effect transistor 200 can be manufactured by a photolithographic method without peeling from the substrate 10.

The present invention can provide an insulating thin film, an insulating thin film having a self-assembled monolayer and a thin film transistor (TFT) having the insulating thin film as a gate insulating layer. In addition, the present invention also provides a liquid crystal image element, an organic electroluminescence and an electronic paper which have an active matrix type TFT array using the TFT as a backplane.

What is claimed is:

1. An insulating thin film comprising:
   a polymer compound;
   a metallic atom bonded to the polymer compound through an oxide atom and selected from a group consisting of a group 4 element, a group 5 element, a group 6 element, a group 13 element, zinc and tin; and
   an organic molecule bonded to the metallic atom through the oxide atom or a nitrogen atom.

2. The insulating thin film according to claim 1, wherein the polymer compound has a hydroxyl group.

3. The insulating thin film according to claim 1, wherein a content ratio of the metallic atom and a monomer of the polymer compound is equal to or more than 1:1 and equal to or less than 1:5.

4. The insulating thin film according to claim 1, wherein a content ratio of the metallic atom and the organic molecule is equal to or more than 1:1 and equal to or less than 1:6.

5. The insulating thin film according to claim 1, wherein a content number of a carbon atom is equal to or more than five times as large as a content number of the metallic atom.

6. The insulating thin film according to claim 1, wherein a relative permittivity is equal to or more than 3.9 and equal to or less than 6.0.

7. A field-effect transistor comprising:
   a substrate;
   a gate electrode formed on the substrate;
   a gate insulating layer including the insulating thin film according to claim 1;
   a semiconductor formed on the gate insulating layer; and
   a source electrode and a drain electrode connected to the semiconductor.

8. The field-effect transistor according to claim 7, further comprising a self-assembled monolayer at an interface between the gate insulating layer and the semiconductor.

9. A field-effect transistor comprising:
   a substrate;
   a gate electrode;
   a gate insulating layer;
   a source electrode;
   a drain electrode;
   a semiconductor; and
   an under-layer having the insulating thin film according to claim 1 on the substrate.

10. The field-effect transistor according to claim 9 further comprising:
    the semiconductor formed on the under-layer;
    the source electrode and the drain electrode connected to the semiconductor;
    the gate insulating layer formed on the semiconductor; and
    the gate electrode formed on the gate insulating layer.

11. The field-effect transistor according to claim 10, comprising a self-assembled monolayer on the under-layer.

12. An image display unit comprising the field-effect transistor according to claim 7.

* * * * *